United States Patent [19]

Ishizu et al.

[11] Patent Number: 4,822,751

[45] Date of Patent: Apr. 18, 1989

[54] METHOD OF PRODUCING A THIN FILM SEMICONDUCTOR DEVICE

[75] Inventors: Akira Ishizu, Amagasaki; Tadashi Nishimura; Yasuo Inoue, both of Itami, all of Japan

[73] Assignee: Mitsubishi Denki Kabushi Kaisha, Tokyo, Japan

[21] Appl. No.: 30,904

[22] Filed: Mar. 31, 1987

[30] Foreign Application Priority Data

Apr. 2, 1986 [JP] Japan .................................. 61-77413

[51] Int. Cl.⁴ .......................................... H01L 21/268
[52] U.S. Cl. ....................................... 437/173; 437/40; 437/907; 437/908; 437/935; 148/DIG. 91; 148/DIG. 93; 357/23.7; 427/53.1
[58] Field of Search ....................... 427/53.1; 357/23.7; 437/40, 173, 174, 907, 908, 973, 935; 148/DIG. 91, DIG. 92, DIG. 93, DIG. 94

[56] References Cited

U.S. PATENT DOCUMENTS 4,624,737 11/1986 Shimbo ............................... 437/195

OTHER PUBLICATIONS

Bäuerle, "Production of Microstructures by Laser Pyrolysis", Mat. Res. Soc. Symp. Proc., vol. 17, Elsevier Science Publishing Co., Inc., 1983, pp. 19-28.
Sze, Physics of Semiconductor Devices, John Wiley and Sons, 1969, pp. 568-586.
Bäuerle et al., "Laser Induced Chemical Vapor Decomposition of C and Si", Appl. Phys. B, vol. 28, pp. 267-268.
V. Baranauskas et al., "Laser-Induced Chemical Vapor Deposition of Polycrystalline Si from $SiCl_4$", Applied Physics Letter, 36(11), Jun. 1, 1980.
D. Bauerle et al., "$Ar^+$ Laser Induced Chemical Vapor Deposition of Si from $SiH_4$", Applied Physics Letter, 40(9), May 1, 1982.
Ishizu et al., "Direct Pattern Writing of Silicon by Argon Laser Induced CVD", Proceedings of Symposium on Dry Process (Oct. 24-25, 1985), Tokyo, pp. 13-18.

Primary Examiner—Brian E. Hearn
Assistant Examiner—M. Wilczewski
Attorney, Agent, or Firm—Saidman, Sterne, Kessler & Goldstein

[57] ABSTRACT

A thin film semiconductor device is formed by preparing a substrate, forming a pattern of metal thin film on the substrate, forming an insulating layer on the metal thin film, and forming a pattern of a semiconductor thin film active layer, which is self-aligned to the pattern of the metal thin film, by laser CVD.

10 Claims, 3 Drawing Sheets

METHOD OF PRODUCING A THIN FILM SEMICONDUCTOR DEVICE

BACKGROUND OF THE INVENTION

The present invention relates to a thin film semiconductor device, such as a thin film transistor (TFT) formed on a substrate, such as a transparent substrate, and a method of producing the thin film semiconductor device. More specifically, the invention relates to a new method of forming a semiconductor active layer in such a device.

In recent years, applications of thin film semiconductor devices such as thin film transistors (TFTs) to liquid crystal display devices and three-dimensional circuit devices have been studied and developed actively.

In applications of TFTs to liquid crystal display devices, TFTs are incorporated in the respective picture elements (pixels) arranged in a matrix in a liquid crystal display device with a low drive voltage and a small power consumption to obtain a flat display device having a good picture quality. It is expected that the liquid crystal image display devices will be wide-spread, replacing CRTs.

FIG. 1 shows an equivalent circuit of one of the pixels of a liquid crystal display device. The pixels arranged in a matrix form an image. Each pixel is selected by a gate line 21 for transmitting a scan signal, and a source line 22 for transmitting a video signal. Each pixel comprises a TFT 27 having a gate 25 connected to the gate line 21, a source 23 connected to the source line 22, and a drain 24 connected to a liquid crystal layer 26.

The TFT in such an application is required to have a sufficiently large ON current Ion to give a sufficient potential to the liquid crystal layer 26 in a short writing time, and a sufficiently small OFF current Ioff to hold the signal for a period (frame period) of one selection to the subsequent selection.

FIG. 2 shows a plot of $I_D$ (drain current) versus $V_G$ (gate voltage), which is the switching characteristic of the TFT. The characteristic under normal conditions is shown by curve 31, with Ioff at 33. When the channel part of the TFT is illuminated by an incident light from the outside, carriers are generated by the incident light and photo-current flows. The characteristic is therefore as shown by curve 32 with Ioff at 34, higher than 33. With the elevated Ioff, holding the signal for the frame period is difficult and the picture quality of the display becomes poor.

To eliminate the problem, TFTs are provided with an incident light shielding layer.

FIG. 3 shows an example of a conventional TFT. A transparent substrate 1 may be of quartz, on which an incident light shielding layer 2 is formed by, for example, first depositing by sputtering or the like a thin film of chrome or the like and patterning the thin film by photolithography and etching. An insulating layer 3 of silicon oxide film or the like is formed over the entire surface of the incident light shielding layer 2. A polysilicon layer is then deposited over the entire surface by reduced pressure CVD (chemical vapor deposition). The polysilicon layer is then subjected to complicated photolithography, and selective oxidation to be formed into an active layer 6 in an island form. To improve the performance of the TFT, the active layer 6 is re-crystalized by argon laser. FIG. 3 also shows a gate oxide film 8, a gate 9 formed for instance of polysilicon, a source electrode 10, a drain electrode 11 and a gate electrode 12.

To form the TFT with the improved performance, the incident light shielding layer 2 must first be formed by photolithography and etching, and then the semiconductor active layer must then be formed by even more complicated photolithography and selective oxidation. Moreover, the laser recrystalization process is conducted to improve the performance. Thus the process of fabrication is complicated.

SUMMARY OF THE INVENTION

An object of the invention is to enable production of a TFT and other thin film semiconductor devices with an improved characteristic by a simpler process.

According to a first aspect of the invention, there is provided a thin film semiconductor device comprising a semiconductor thin film active layer, and a metal thin film formed on a substrate, the metal thin film having a pattern corresponding to the pattern of the semiconductor active layer, the semiconductor active layer being formed selectively over the metal thin film by laser CVD.

According to a second aspect of the invention there is provided a thin film semiconductor device comprising a semiconductor thin film active layer, a metal thin film formed on a transparent substrate to have a pattern corresponding to the pattern of the semiconductor thin film active layer, and a silicon oxide film formed on the metal thin film, the semiconductor thin film active layer being formed selectively over the metal thin film by laser CVD using argon laser light.

According to a third aspect of the invention, there is provided a method of producing a thin film semiconductor device comprising the steps of
preparing a substrate,
forming a pattern of metal thin film on the substrate,
forming an insulating layer on the metal thin film, and
forming a pattern of a semiconductor thin film active layer over the pattern of the metal thin film by laser CVD.

By use of the selective laser CVD on the metallic thin film to form a semiconductor thin film which is used as the active layer, complicated photolithography, selective oxidation, laser recrystalization and the like are no longer necessitated.

BRIEF DESCRIPTION OF THE DRAWINGS

In the accompanying drawing.

DETAILED DESCRIPTION OF THE PREFERRED EMBODIMENTS

Figure 1:
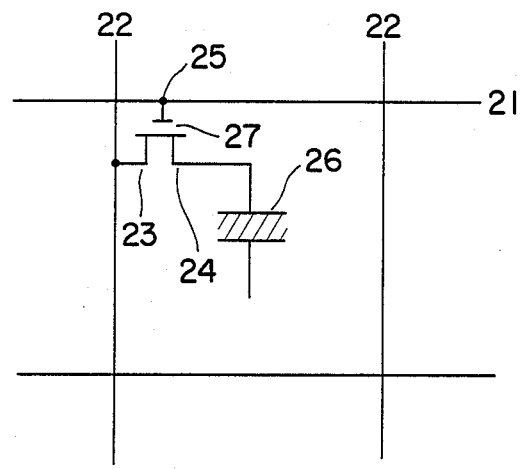
-
FIG. 1 is a diagram showing an equivalent circuit of part of a liquid crystal display device incorporating a TFT.
Figure 2:
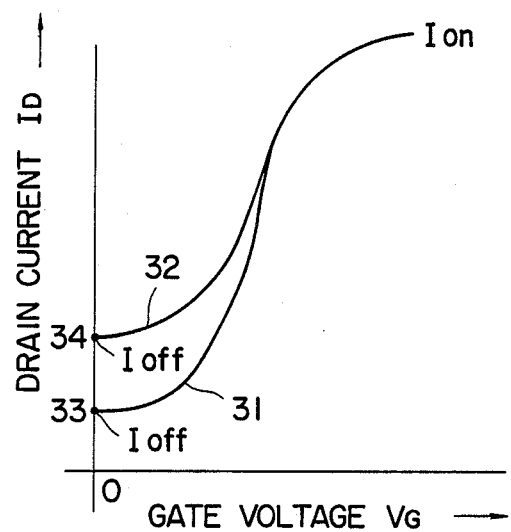
FIG. 2 is a diagram showing $I_D$–$V_G$ characteristics illustrating the switching characteristics of a TFT.
Figure 3:
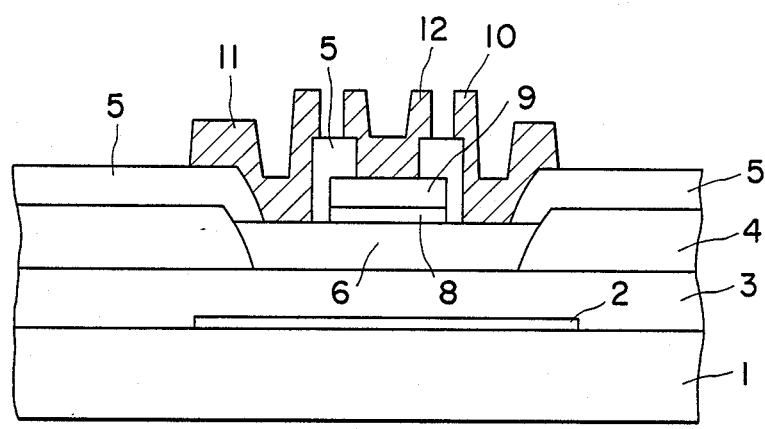
FIG. 3 is a sectional view showing the structure of an example of a conventional TFT.
Figure 4:
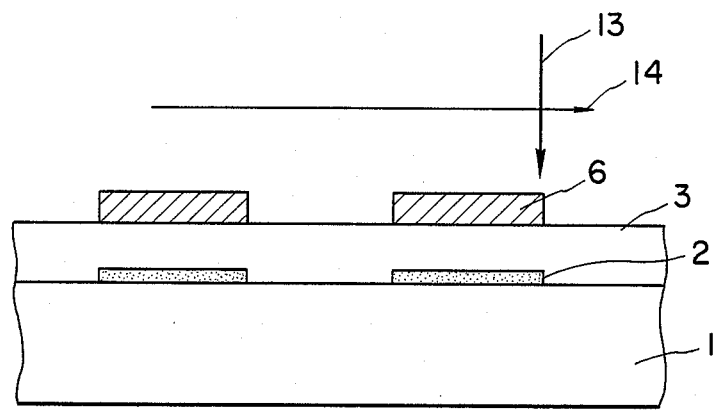
FIG. 4 is a sectional view showing a production step of a TFT of an embodiment of the invention.

FIG. 4 shows production of a TFT of an embodiment of the invention, particularly how an incident light shielding layer and the semiconductor active layer are formed.

First, a transparent substrate 1 of quartz or the like is prepared. Then a thin film of chrome or the like is formed on the entire surface by sputtering or the like. The thin film is then patterned by photolithography and etching to form islands as indicated by reference numeral 2. An insulating layer 3 (of silicon oxide or the like) is deposited on the entire surface.

The substrate with the above-described layers is then placed in a chamber $SiH_4$ atmosphere or the like, and is illuminated by an argon laser light beam 13 normal to the substrate surface and scanning in the direction 14 parallel to the substrate surface. The illuminating laser light 13 is absorbed by the thin film layer 2 and generates heat, which conducts through the insulating layer 3, and heats and dissolves the $SiH_4$ gas near the surface of the insulating layer 3, so that silicon 6 is selectively deposited on the surface directly over the thin film layer 2. In other words, the silicon layer 6 is formed over the metal layer 2 in a self aligned manner. Therefore, the pattern of the layer 2 is initially defined so that its pattern corresponds to the desired pattern of the layer 6.

It has been confirmed that the silicon formed on a silicon oxide film by laser CVD using argon laser light is crystalized (Ishizu, et at.; 7-th Dry Process Symposium I-3, 1985-10). The metallic film 2 and the crystalized silicon layer 6 thus formed can be utilized as the incident light shielding layer and the semiconductor active layer, without first being subjected to complicated processing, such as laser annealing, or the like.

Figure 5:
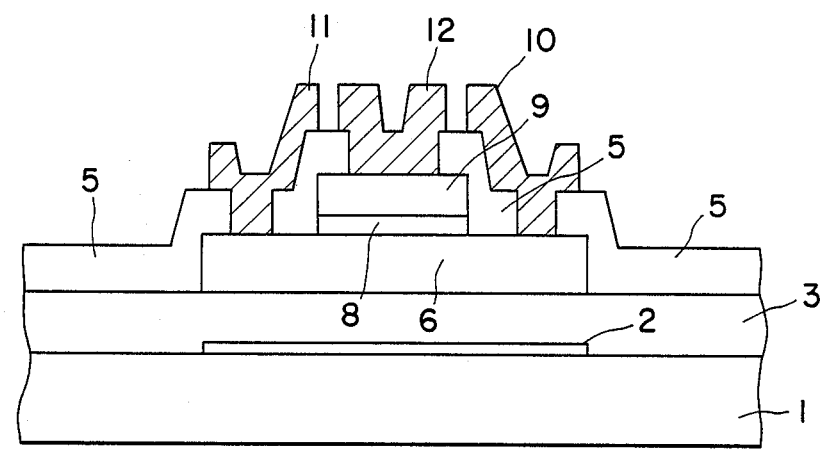
FIG. 5 is a sectional view showing a TFT of an embodiment of the invention.

Further processing may be conducted to form a desired element. To form a TFT, as shown in FIG. 5, a gate oxide film 8, a gate 9 of polysilicon or the like and an oxide film 5 are formed, and a source electrode 10, a drain electrode 11 and a gate electrode 12 of aluminum or the like are formed.

Thus, an incident light shielding layer formed by photolithography is utilized as a light absorbing layer in laser CVD, and a crystalized silicon layer is formed by self alignment. In this way, the method of the invention eliminates the need to resort to the complicated photolithography, selective oxidation, laser recrystalization and the like which were required in the conventional method, so that fabrication is much simplified, and a TFT or other thin film semiconductor devices with a high performance can be produced.

In the embodiment described above, the TFT is used for switching a pixel of a liquid crystal display device. The invention is also applicable where the TFT is incorporated in a drive circuit of the liquid crystal display device integrally formed at the periphery of a chip. The TFT according to the invention can also be incorporated in a three-dimensional circuit device, a facsimile reeding sensor controller, and other electronic devices.

What is claimed is:

1. A method of producing a thin film semiconductor device, comprising the steps of:
   preparing a substrate,
   forming a patterned metal thin film on said substrate,
   forming an insulating layer on said metal thin film, and
   forming a patterned semiconductor thin film active layer, which overlies and is self-aligned to said patterned metal thin film, by laser CVD wherein a laser beam is scanned unselectively across the surface of said substrate.

2. A method according to claim 1, wherein said substrate is formed of quartz.

3. A method according to claim 1, wherein said metal thin film is formed of chromium.

4. A method according to claim 1, wherein said insulating film is formed of silicon oxide.

5. A method according to claim 1, wherein said laser CVD step is conducted in an $SiH_4$ atmosphere.

6. A method according to claim 1, wherein said laser CVD step uses an argon laser.

7. The method of claim 1, further comprising the subsequent steps of forming a gate oxide on at least a portion of said active layer, and forming a gate on at least a portion of said gate oxide.

8. The method of claim 1, further comprising the subsequent steps of forming a gate oxide on at least a portion of said active layer, forming a gate on at least a portion of said gate oxide, and providing source and drain electrodes contacting respective portions of said active layer.

9. The method of claim 1, wherein said substrate is transparent.

10. A method of producing a thin film semiconductor device, comprising the steps of:
    preparing a substrate,
    forming a patterned metal thin film on said substrate,
    forming an insulating layer on said metal thin film, and
    forming a patterned semiconductor thin film active layer, which overlies and is self-aligned to said patterned metal thin film, by laser CVD;
    wherein, during said laser CVD step, a laser beam is scanned unselectively across the surface of said substrate.

* * * * *